(12) United States Patent
Niegel et al.

(10) Patent No.: US 6,735,239 B1
(45) Date of Patent: May 11, 2004

(54) SEQUENCE GENERATOR

(75) Inventors: Michael Niegel, Lauf (DE); Ralf Kukla, Nürnberg (DE); Seyed-Hami Nourbakhsh, Nürnberg (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/310,068

(22) Filed: May 11, 1999

(30) Foreign Application Priority Data

May 11, 1998 (DE) .......................... 198 21 004

(51) Int. Cl.[7] .............. H04B 1/707; G06F 7/58
(52) U.S. Cl. ............... 375/140; 375/141; 375/146; 375/147; 375/150; 375/152; 375/343; 708/252
(58) Field of Search ................. 375/130, 140, 375/141, 142, 143, 146, 147, 150, 152, 343; 331/78; 708/250, 252; 327/164; 711/109

(56) References Cited

U.S. PATENT DOCUMENTS

| | | | |
|---|---|---|---|
| 4,404,644 A | 9/1983 | Howie | 364/718 |
| 4,771,429 A | 9/1988 | Davis et al. | 371/27 |
| 4,893,339 A | * 1/1990 | Bright et al. | 380/28 |
| 5,754,353 A | * 5/1998 | Behrens et al. | 360/53 |

FOREIGN PATENT DOCUMENTS

| | | |
|---|---|---|
| DE | 44 09 341 A1 | 9/1995 |
| DE | 197 17 110 A1 | 10/1998 |
| EP | 0 438 322 A2 | 7/1991 |
| EP | 0 620 518 A1 | 10/1994 |
| SU | 1248030 A1 | 7/1986 |
| WO | WO 93/18601 | 9/1993 |
| WO | PCT/EP 99/02812 | 9/1999 |

OTHER PUBLICATIONS

Database WPI Section EI, Week 8713, Derwent Publications Ltd., London, GB; AN 87–092023, XP–002113152 and SU 1 248 030 A (Mamchenko, G. A.), Jul. 30, 1986 Abstract.

* cited by examiner

Primary Examiner—Young T. Tse
Assistant Examiner—David B. Lugo

(57) ABSTRACT

A sequence generator for generating sequences of binary or discrete values may be flexibly adjusted to requirements. Shift register memory locations may be selected as feed-back locations for generating a feed-back signal. Further, shift register memory locations may be selected as feed-in locations for receiving the feed-back signal. A plurality of control memory locations store a control bit sequence for controlling the sequence generator. The sequence generator may be used as a longcode and/or shortcode generator in a CDMA-telecommunications system.

29 Claims, 5 Drawing Sheets

SEQUENCE GENERATOR

FIELD OF INVENTION

The present invention relates to a sequence generator for generating sequences of values.

BACKGROUND OF THE INVENTION

In an increasing number of technical fields, the transmission and processing of analog signals is successively being replaced by transmission and processing of digitally represented signals or data. Digital transmission or processing of data provides advantages as compared to an analog transmission or processing of signals, especially with the availability of cheap computing power, required for an efficient handling of digital data.

A trend towards digitalization is also evident in telecommunications systems, where an analog handling of data is successively being replaced by digital representation, processing and transmission of data.

For example, a CDMA (code division multiple access) telecommunications system may be mostly digital, i.e., it can represent, process and transmit voice signals, user data and control data within the system in a digital form.

In a CDMA system a plurality of different communication channels is combined to form a single signal to be transmitted to a receiving station. At the receiving station each of the plurality of communication channels is recovered from the transmitted signal. However, to be able to do so, before combining the communication channels, data of each communication channel need to be digitally marked in order to be able to distinguish the individual channels after reception at the receiving station. This processing of data of a communication channel may include spreading the narrow banded signal of each particular communication channel into a wide band signal using a shortcode.

A shortcode is a defined sequence of bits or chips, which is preferably orthogonal to other shortcodes. Spreading of communication channel data may be achieved by representing each single bit-value of channel data by the shortcode or the inverted shortcode, respectively. For example, each logical 1 may be represented by the shortcode itself and each logical 0 may be represented by the inverted shortcode, or vice versa. The lengths of different shortcodes vary, e.g., from 16 chips to 128 chips.

After the spreading operation, the spread channels are combined to form a wideband CDMA-signal which is then transmitted via an air interface, e.g., from a base station of a CDMA telecommunications network to a receiving station.

Before transmission, the CDMA signal may be further processed using a so called longcode, e.g., to be able to reuse a set of shortcodes or to provide a higher level of data security. A longcode, similar to a short code, is constituted by a defined sequence of binary values or symbols, for example a pseudo-random sequence. The longcode may be processed with the combined channel data using, e.g., a XOR (Exclusive OR) operation. The receiving station may recover the original signal by using the identical longcode and a reverse logical operation.

In order to be readily available for processing, longcodes and shortcodes may be generated beforehand and stored in a memory device. However, storing a larger number of different short and/or longcodes requires large memories, which is expensive. Moreover, the memory devices need to be fast, in order to meet extremely high processing speeds in a telecommunications system. Further, different specialized pseudo-noise generators could be provided for generating different short and longcodes, e.g., needed for different system standards, but this is impractical, and alternative methods are sought.

SUMMARY OF THE INVENTION

It is therefore an object of the invention to provide a flexible sequence generator for generating different defined sequences of values.

The object of the invention is solved by an apparatus for generating sequences of values, comprising: a shift register having a plurality of register memory locations; selection means for selecting at least one register memory location as a feed-back location and at least one arbitrary register memory location as a feed-in location; processing means for processing output signals received from the at least one arbitrary register memory location selected as the feed-back location; and feeding means for feeding an output signal from the processing means to the at least one register memory location selected as the feed-in location.

Advantageously, at least one arbitrary shift register memory location may be selected as a feed-back location and at least one arbitrary shift register memory location may be selected as a feed-in location, and thus a plurality of different defined sequences of values can be generated, without changing a hardware configuration. The number of register memory locations active in generating a defined sequence of values may be set by selecting a first feed-in location, and the feed-back characteristic may be set by selecting at least one feed-back location. Accordingly, the sequence generator of the invention can be flexibly adapted to generate different defined sequences of discrete values and can thus be readily adapted, e.g., to system specifications.

First selection means may be provided for selectively connecting an output terminal of a register memory location to processing means, and second selection means may be provided for selectively connecting feeding means to a register memory location selected as a feed-in location. Advantageously, first and second selection means are controlled by control means.

Further, the processing means may include a plurality of processing units, for processing output signals of the at least one register memory location selected as the feed-back location, to form a signal to be fed to the at least one register memory location selected as the feed-in location. Advantageously, the processing means may perform a logical Exclusive OR (XOR) operation.

The object of the invention is further solved by an apparatus for generating sequences of values, comprising: a shift register having a plurality of register memory locations; selection means for selecting at least one register memory location as a feed-back location and at least one arbitrary register memory location as a feed-in location; processing means for processing output signals received from the at least one arbitrary register memory location selected as the feed-back location; feeding means for feeding an output signal from the processing means to the at least one register memory location selected as the feed-in location; wherein the selection means include data providing means for providing binary data for selecting the at least one feed-back register memory location and the at least one feed-in register memory location.

Advantageously, control means may include memory means or data providing means for storing or providing a bit sequence, the logical values of which being employed for defining the at least one feed-back location and the at least one feed-in location.

Further, the memory means may be provided with logic circuitry which controls the first and second selection means such that a first logical 1 of the bit sequence defines a feed-in location and each subsequent logical 1 defines a feed-back location, or such that a first logical 0 of the bit sequence defines a feed-in location and each subsequent logical 0 defines a feed-back location.

Further advantageous features of the invention are defined in further dependent claims.

The invention may be best understood, if the description is read together with the accompanying drawings, wherein:

DETAILED DESCRIPTION OF EMBODIMENTS

In a following, the first embodiment of the invention will be described with respect to FIG. 1 and FIG. 4.

A sequence generator may be realized as a hardware device, which generates a defined sequence of a predetermined number of binary or discrete values. A sequence generator may, for example, be implemented using a shift register having a characteristic feed-back arrangement, as well known in the art. In this case, the sequence generator outputs a defined sequence having a defined number of samples. If the generator is continuously operated, the defined sequence of values is repeated. The sequence of samples will be determined by the number of register memory locations and the specific feed-back arrangement provided. A sequence generator for generating a longcode may, e.g., comprise 18–41 register memory locations or stages. A corresponding longcode will thus be constituted by $2^{18}$ to $2^{41}$ samples.

Figure 4:
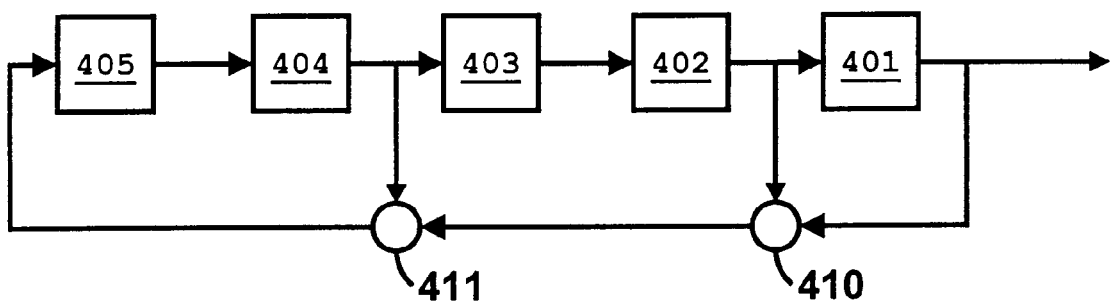
FIG. 4 shows an exemplary block diagram of a sequence generator.

FIG. 4 illustrates a sequence generator. A shift register having a plurality of register locations 401–405 is shown. Each of the register memory locations can store a binary or discrete value. The shift register may, e.g., be realized using flip-flops connected in series, as well known in the art. Thus, the output terminals of individual register memory locations are connected to input terminals of respective adjacent register memory locations. The output of register memory location 401 is output for further processing.

The shift register is provided with a feed-back arrangement 410, 411. The feed-back arrangement processes output signals of register memory locations 401 and 404 and feeds the processing result back to the input terminal of register memory location 405.

As commonly known, each register memory location corresponds to a particular stage of the shift register, each stage having an "order". In the present case, the first stage comprising register memory location 401 has the order 1, the second stage comprising register memory location 402 has the order 2, etc. Since five register memory locations are provided, the resulting sequence generator is of $5^{th}$ order.

For each clock cycle a stored value of each register memory location is output via the output terminals and a new value is read via the input terminals of respective register memory locations. The output of the register memory location, having the lowest order, in the example register memory location 401, is output for further processing. The outputs of the first, second and fourth register memory locations are processed and the processed result is fed back as a feed-back signal to the input terminal of the register memory location having the highest order, which, in the present example, is the fifth register memory location 405.

This specific circuit of the example will generate a single defined sequence of values. If different sequences of values are desired, a shift register having a different order and/or a different feed-back arrangement must be provided.

However, in applications such as a CDMA-system, accommodating the sequence generator to requirements, which might arise from a system characteristic or external constraints, such as a data communication standard, is difficult and expensive. Either a large number of different sequence generators must be provided or an existing sequence generator of a system must be exchanged.

Figure 1:
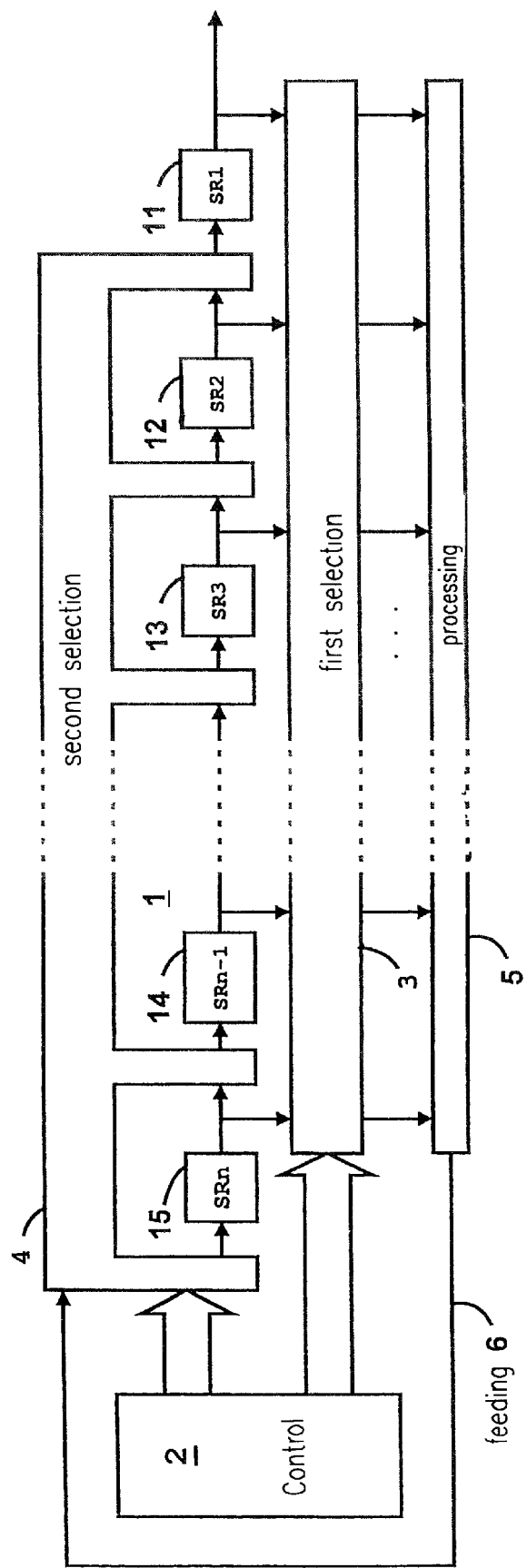
FIG. 1 shows an exemplary block diagram of a first embodiment of the invention.

Therefore, a sequence generator may preferably be realized by a flexible device shown in FIG. 1. The device of FIG. 1 includes a shift register 1 having a plurality of register memory locations 11, 12, 13, 14, 15. The number of register memory locations is arbitrary. For example, a shift register having a number of n=32 register memory locations may be provided. The shift register may, e.g., be realized using a plurality of flip-flops connected in series.

As before, the first register memory location, denoted 11, is the first order register memory location and corresponds to a first stage of the shift register 1. Analogously, all subsequent register memory locations correspond to subsequent stages of the shift register. Thus, the $n^{th}$ register memory location is the register memory location of the $n^{th}$ order and corresponds to the $n^{th}$ stage.

The shift register may be connected to external devices for further processing via an output terminal of the first register memory location. However, in other embodiments, it is possible that other or possibly all register memory locations are connected to the outside world for further processing.

Each of the plurality register memory locations can store a binary or discrete value.

An output terminal of each register memory location is connected to first selection means 3, and an input terminal of each register memory location is connected to second selection means 4.

Further, the first selection means 3 are connected to the second selection means 4 via processing means 5 and feeding means 6. The processing means may combine a plurality of output signals received from the first selection means 3 to form a feed-back signal to be transmitted to the second selection means 4 via the feeding means 6.

The first selection means 3 selects register memory locations as feed-back locations by connecting output terminals of respective register memory locations with the processing means 5.

Register memory locations are selected as feed-back locations in response to control signals received from control means 2. The control signals are supplied to the first selection means 3 and cause the first selection means to connect selected register memory locations with the processing means 5. For example, in the embodiment of FIG. 1, the control signals received from the control means 2 could be such that the output terminal of the first register memory location 11 and the output terminal of the second register memory location 12 are being connected to the processing means 5, whereas the output terminals of the remaining register memory locations, which, in the present example, are the third register memory location 13, and all register memory locations of stages having a higher order, will not be connected to the processing means 5.

The second selection means 4 selects one register memory location as a feed-in location, for supplying a feed-back signal received from the processing means 5 via feeding means 6. Register memory locations selected as feed-in locations may additionally be connected to a register memory location of a subsequent shift register stage of higher order, depending on the control signals received. In this case, output signals received from a shift register location higher order and received from the feeding means will be processed before being supplied to the input of the register memory location selected as feed-in location. The processing may, e.g., be constituted by an XOR operation or an add operation. Register memory locations not selected as feed-in locations are connected to the register memory location of the subsequent stage of higher order.

As with the first selection means 3, the second selection means 4 receive control signals supplied by the control means 2, allowing to connect a shift register location to the feeding means 6 and/or to a register memory location of a subsequent shift register stage of higher order. For example, control signals received from the control means 2 could result in selecting the input terminal of the fourth register memory location 14 of the fourth shift register stage as a feed-in location and the output terminal of register be memory location 13 of the third stage as a feed-back location. The remaining register memory locations may, e.g., not be selected as feed-in locations an thus are connected to the register memory location of the respective subsequent stage of higher order. If additionally the input terminal of the third shift register location 13 is selected as a feed-in location, an output signal of shift register location 14 and the feed-in signal will be processed before being supplied to the input terminal of shift register location 13, as outlined above.

The shift register location selected as a feed-in location having the highest order will preferably not be connected to the subsequent shift register location higher order.

In the present example, it is assumed that a register memory location can only be selected as a feed-back location, if itself is selected as a feed-in location and/or a register memory location having a higher order is selected as a feed-in location. However, in further embodiments, this constraint may not be necessary.

Further, in the present example, an arbitrary number of register memory locations may be selected as feed-back locations and an arbitrary number of register memory locations may be selected as feed-in locations. However, in other embodiments it may be preferred, that only one register memory location may be selected as a feed-in location.

In the following, the operation of the sequence generator according the first embodiment of the invention is described with respect to FIG. 1.

The sequence generator of the first embodiment of the invention may be flexibly configured via control signals generated by the control means 2. Thus, the sequence generator may be used for generating different defined sequences of values. Arbitrary register memory locations may be selected as feed-back locations, and arbitrary register memory locations may be selected as a feed-in location. Therefore, the number of stages and thus the order of the resultant sequence generator and the feed-back characteristic of the sequence generator may be specified.

For example, in the present embodiment, if the third register memory location 13 is selected as feed-in location, three register memory locations of the n register memory locations of the shift register will be active in generating a code sequence. All register memory locations of higher order would be bypassed and not actively contributing to an output signal of the sequence generator.

Before operations, the shift register may be initialized using an initial sequence of values which is loaded into respective register memory locations. In case the sequence generator is adapted to generate a sequence of binary values, the shift register could be initialized using a sequence of binary values. In case the sequence generator is adapted to generate discrete values, the shift register could be initialized with discretized values of arbitrary magnitude.

Further, before operations, control signals will preferably be applied to the first selection means 3 and to the second selection means 4. As outlined above, the control signals are generated by the control means 2 and will select register memory locations as feed-back locations and register memory locations as feed-in locations, as outlined in detail above. Preferably, in the example, the control signals generated by the control means 2 are static during operation, i.e., during the generation of a specific defined sequence of values the control signals do not change. However, the invention is not limited to static control signals, in further embodiments the control signals may be dynamically changed during operations.

For each clock cycle, in accordance with the internal connections established in accordance with applied control signals, as outlined above, a value is output/input from/to each register memory location. Signals received by the processing means 5 are processed and fed via. feeding means 6 to the register memory location selected as the feed-in location. That is, for each cycle, signals output by register memory locations selected as feed-back locations are input to the processing means 5, processed and forwarded to the second selection means 4 via said feeding means 6, and supplied to the at least one register memory location selected as the feed-in location.

The processing means 5 processes said input signals to form a feed-back signal which is fed to the second selection means 4. In order to combine the received output signals from the register memory locations to a single signal, the processing means 5 may perform any logical or arithmetic operation, e.g. adding operations, AND, OR, XOR operations, etc., or a combination thereof.

The output of the register memory location with the lowest order, in the present example register memory location 11, may be fed to an external device. Thus, for each clock cycle the sequence generator may output one sample of the defined sequence of values.

The sequence of defined values depends on the control signals generated by the control means 2 and applied to the first and second selection means 3, 4, as outlined before. Thus, in accordance with the control signals applied, the apparatus according to the first embodiment of the invention is able to generate defined sequences of values of different length and characteristics.

For example, in case the sequence generator is adapted to generate a binary sequence of data and three register memory locations are active, i.e., the third register memory location 13 has been selected as a feed-in location, a sequence of values generated by the device will have a length $2^3$. If all n register memory locations of the shift register are active, the resulting codes will have a length $2^n$. Different codes having the same length may be generated by selecting different ones of the register memory locations as feed-back locations.

In the embodiment of FIG. 1, register memory locations selected as a feed-in location receive a feed-back signal from the processing means 5 via the feeding means 6. This signal completely depends on the states of the respective register memory locations. In further embodiments, however, it is possible, that the feed-back signal is combined or further processed with an external input signal, received from an external device, before being fed to the register memory locations selected as feed-in locations.

In the following, with respect to FIG. 2a, a second embodiment of the invention will be described.

The sequence generator of FIG. 2a again comprises a shift register 1 having a plurality of register memory locations 11–14. For simplicity reasons, the example of FIG. 2 is shown comprised of four register memory locations 11–14. However, in general, an arbitrary number of register memory locations may be provided.

Figure 2A:
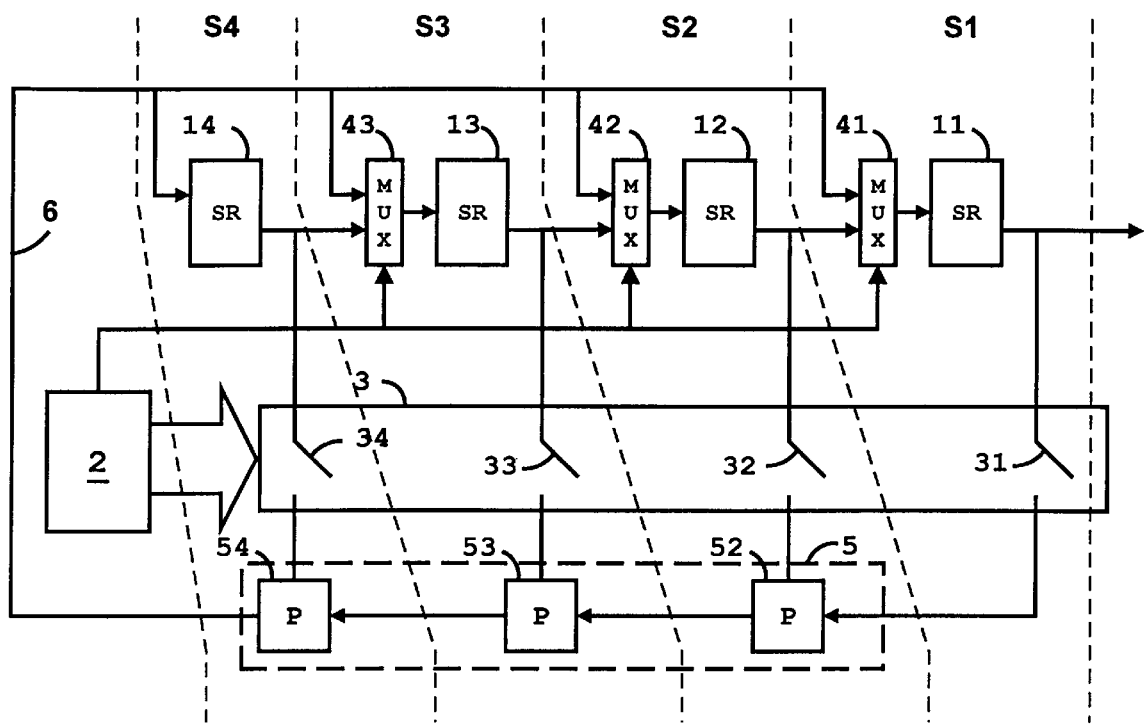
FIG. 2a shows an exemplary block diagram of a second embodiment of the invention.

The arrangement of FIG. 2a also includes first selection means 3, comprising a plurality of feed-back switches 31–34, each associated with one register memory location and connected to the output terminal of the corresponding register memory location, for selectively connecting said output terminals to processing means 5, similar to the first embodiment described with respect to FIG. 1.

The processing means 5 comprise a plurality of processing units 52–54, connected in series and respectively connected to at least one corresponding one of the plurality of feed-back switches. The output of the last processing unit of the series connection is connected to feeding means 6. The feeding means may be a connection on a printed circuit or any other means to transmit data.

Further, the sequence generator of FIG. 2a comprises a plurality of feed-in switches 41–43, comprising second selection means 4. Each of the plurality of feed-in switches 41–43 comprises two input terminals, connectable to an output terminal, in accordance with a control signal received at a control terminal. The output terminal of each feed-in switch is connected to a corresponding input terminal of a corresponding register memory location. One of the input terminals of each of the plurality of feed-in switches 41–43 is connected to an output terminal of a register memory location of a succeeding stage having a higher order. The other input terminal of each of the feed-in switches is connected to said feeding means 6.

Thus, the input terminal of a register memory location may either be connected to the output terminal of a register memory location having the next higher order, via the corresponding one of the feed-in switches, or may be connected to the feeding means 6, depending on the state of the switch.

The arrangement of FIG. 2a, corresponding to the second embodiment, may be seen as comprised of a plurality of generator stages S1–S4 connected in series. Each stage corresponds to a particular register memory location, the first stage corresponding to the first register memory location, in the present example register memory location 11, and succeeding stages corresponding to succeeding register memory locations.

Three different types of stages may be defined.

A first stage type is constituted by the first stage of the sequence generator, including the first register memory location and the first feed-back switch, which in the present example are register memory location 11 and feed-back switch 31, and the first feed-in switch, which in the present example is feed-in switch 41.

This first stage is followed by a series connection of a plurality of identical stages of a second type. Stages of the second type, in the present example, are the second and the third stage of the sequence generator. A stage of the second type comprises of a register memory location, a feed-back switch, a feed-in switch and a processing unit. For example, the second stage of the present embodiment is comprised of the second register memory location 12, the second feed-back switch 32, the second feed-in switch 42 and processing unit 52.

The sequence of identical stages of the second type is followed by a single stage of the third type, constituting the last stage of the sequence generator. This stage of the third type comprises a register memory location, a corresponding feed-back switch and a processing unit. In the present embodiment, the fourth stage S4 constitutes a stage of the third type and comprises the fourth register memory location 14, the fourth feed-back switch 34 and processing unit 54.

A sequence generator, as described with respect to the second embodiment, always consists of a series connection of a single stage of the first type, an arbitrary number of identical stages of the second type, and a single stage of the third type. In the example of FIG. 2a, only two intermediate stages of the second type are provided. However, a sequence generator may have an arbitrary number of stages of the second type.

The states of both the plurality of feed-back switches 31–34 and the plurality of feed-in switches 41–43 are controlled by control means 2. The control means 2 is therefore able to select a register memory location as a feed-back location, by way of the plurality of feed-back switches 31–34, and is able to select a register memory location as a feed-in location, by switching the plurality of feed-in switches 41–43.

As in the embodiment described with respect to FIG. 1, by way of the control means 2, it is possible to define the active portion of the shift-register by selecting the feed-in location. And, it is further possible to specify the feed-back characteristic of the arrangement by selecting the feed-back locations.

The circuits described with respect to the first and second embodiment may be used in various applications. For example, the circuitry of the second embodiment may be used as a shortcode generator and/or a longcode generator in a CDMA telecommunications system. Accordingly used, the circuit will preferably generate a sequence of binary values, its characteristic defined by the selection of feed-back locations and feed-in locations.

The initialization of the shift register, as outlined above, before operations, will determine the phase within the sequence of samples, i.e. at which location of the sequence of samples the generator starts. Further, as a longcode or shortcode generator, the processing units will preferably perform a logical Exclusive OR operation.

If the sequence generator outputs a longcode, the longcode may, e.g., be used to process a data signal in a Exclusive OR (XOR) operation, in a bitwise fashion, whereby each bit of the data stream is processed with one bit of the longcode generator. If the sequence generator is used to generate a shortcode, the shortcode may be used to spread data of a communication channel, as outlined before.

The apparatuses outlined with respect to the first and second embodiments, may also be used to generate sequences of discrete values.

In the following, with respect to the FIG. 2b–2d, the operation of the sequence generator of the second embodiment will be illustrated by way of examples.

Figure 2B:
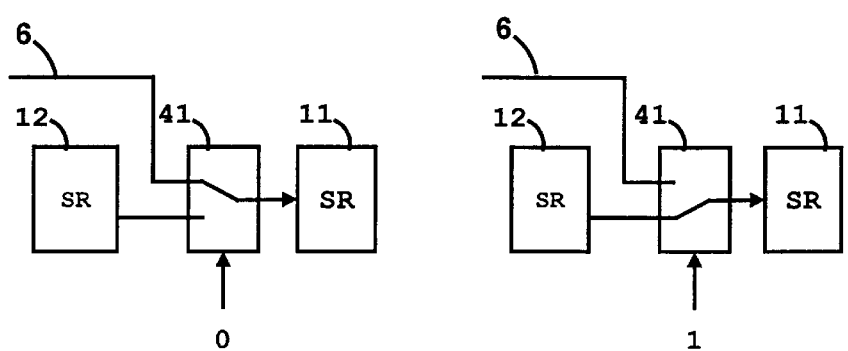
FIG. 2b shows an exemplary portion of the second embodiment of the invention of FIG. 2a for illustrating switching states.

FIG. 2b illustrates switching states of one of the plurality of feed-in switches 41–43. The two switching states of the second feed-in switch 41 are exemplary described.

The feed-in switch receives, from the control means 2, a control signal either corresponding to a logical 0 or corresponding to a logical 1. If a control signal corresponding to a logical 0 is received at the feed-in switch, as illustrated on the left of FIG. 2b, the switch connects its output terminal to the feeding means 6. That is, for a control signal corresponding to a logical 0, a feed-back signal received via the feeding means 6 is input to the corresponding register memory location.

If a control signal corresponding to a logical 1 is received at the feed-in switch, as illustrated on the right side of FIG. 2b, the switch connects its output terminal to the register memory location of the subsequent stage of higher order.

Figure 2C:
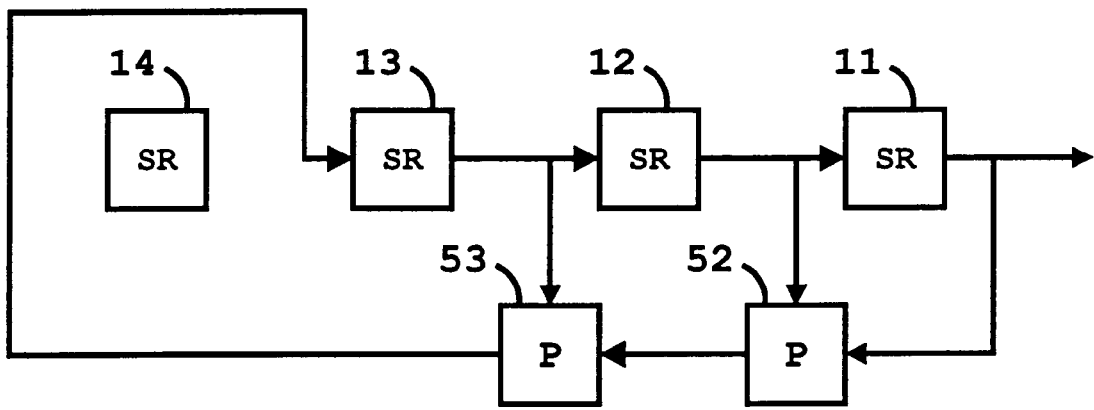
FIG. 2c and FIG. 2d show exemplary equivalent-circuits of the second embodiment the invention according to different states of the control signals.
Figure 2D:
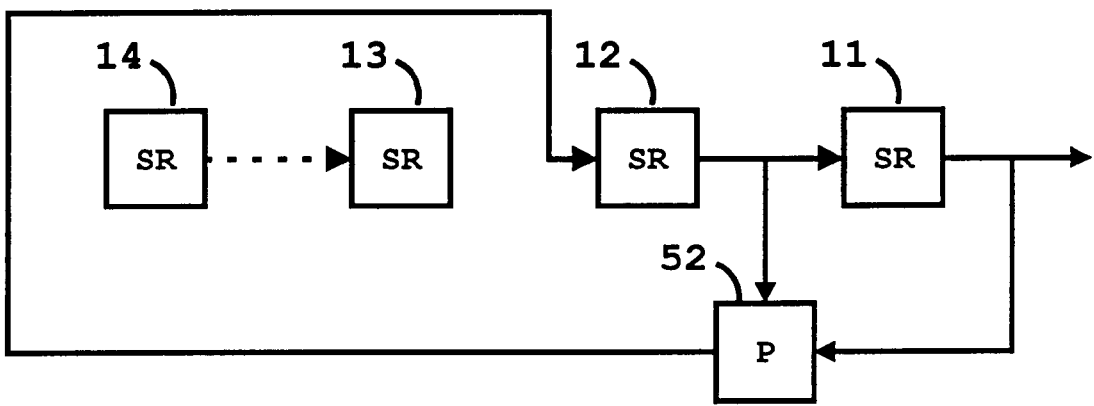

FIGS. 2c and 2d show two equivalent-circuits for two different cases of control signals applied to the feed-back switches and feed-in switches.

In the following, with respect to FIG. 2c, a first case of control signals and the corresponding hardware configuration of the sequence generator according to FIGS. 2a, 2b is outlined. The following control signals are applied to the plurality of feed-back switches 31–34 and the plurality of feed-in switches 41–43:

feed-back switches 31, 32, 33: closed;
feed-back switch 34: open;
feed-in switch 43: logical 0;
feed-in switches 41, 42: logical 1;

With these control signals, as depicted in FIG. 2c, the output terminals of the first, second and third register memory location 11, 12 and 13 will be connected to the processing means 5. Since feed-back switch 34 is open, the output terminal of register memory location 14 will not be connected to the processing means 5.

Further, since feed-in switches 41 and 42 receive a control signal corresponding to a logical 1, first, second and third register memory locations 11, 12, 13 will be connected in series. Feed-in switch 43 receives a control signal corresponding to a logical 0 and therefore will connect the feeding means 6 to the input terminal of the third register memory location 13.

Thus, FIG. 2c represents an equivalent-circuit of the sequence generator of FIG. 2a with the above control signals applied. The output terminals of register memory locations 11, 12 and 13 are selected as feed-back locations, and the input terminal of register memory location 13 is selected as a feed-in location.

In the following, with respect to FIG. 2d, a second case of control signals and the corresponding hardware configuration of the sequence generator according to FIGS. 2a, 2b will be described.

In this case, the following control signals are applied to the feed-back switches and the feed-in switches, respectively:

feed-back switches 31, 32: closed;
feed-back switches 33, 34: open;
feed-in switch 41: logical 1;
feed-in switch 42: logical 0;
feed-in switch 43: "dont't care".

With the above control signals, the sequence generator of FIGS. 2a, 2b will have a hardware configuration equivalent to the circuit of FIG. 2d.

With the feed-back switches 31, 32 closed, the output terminals of the first and second register memory location 11 and 12 are selected as feed-back locations. The output terminals of the third and fourth register memory locations 33 and 34 are not selected as feed-back locations, since the corresponding feed-back switches are open. Further, with the feed-in switch 42 receiving a control signal corresponding to a logical 0, the input terminal of register memory location 12 is selected as feed-in location. Since the feed-in switches 41 receives a control signal corresponding to a logical 1, the input terminal of register memory location 11 is connected to the output terminal of register memory location 12.

In this specific configuration the register memory locations 13 and 14 are inactive, i.e., their states do not influence the output signal of the sequence generator. Further, the state of feed-in switch 43 is irrelevant.

Thus, with control signals of the second case, as outlined above, an equivalent-circuit of the sequence generator of FIG. 2a may be represented as shown in FIG. 2d.

As it can be seen with the above examples of control signals outlined with respect to FIGS. 2c and 2d, the sequence generator of the second embodiment, described with respect to FIGS. 2a and 2b can be easily configured to assume different configurations. This can be achieved by simply applying appropriate control signals to the feed-back switches and feed-in switches, the hardware structure of the sequence generator is not changed. Therefore, the sequence generator according to the invention can be flexibly adapted to requirements.

Figure 3A:
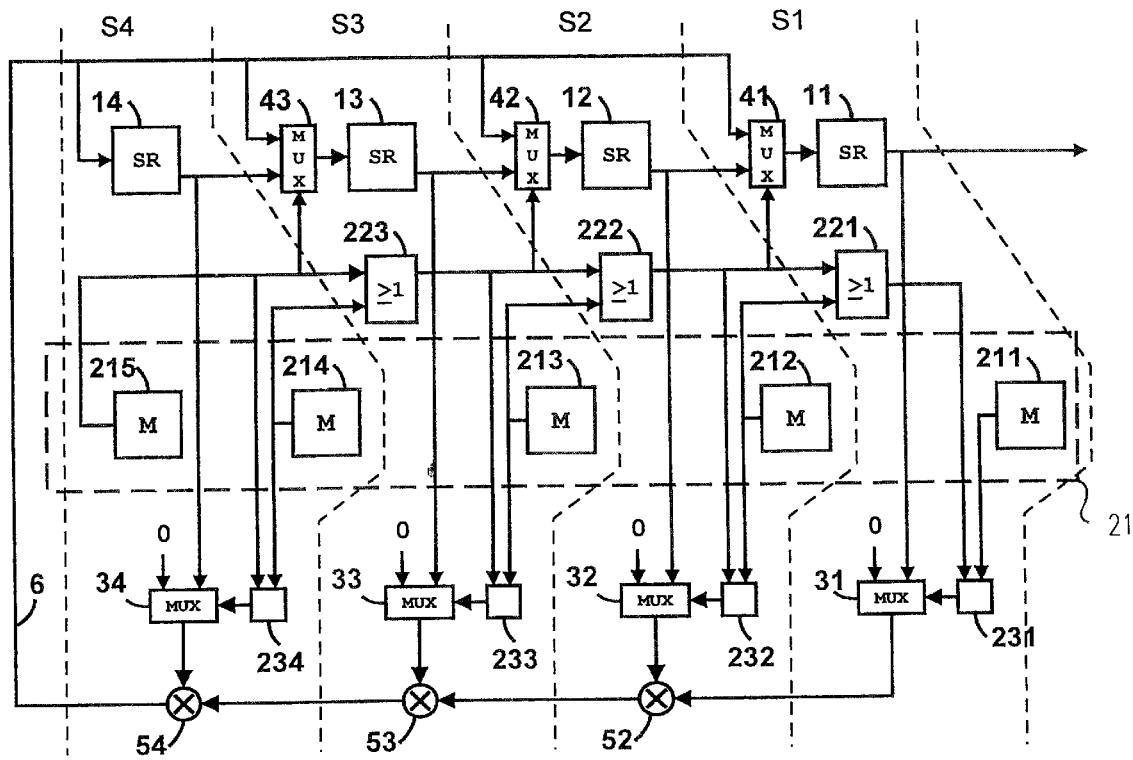
FIG. 3a shows an exemplary block diagram of a third embodiment of the invention.

In the following, a third embodiment of the invention is described with respect to FIG. 3a. FIG. 3a shows a detailed block diagram of a sequence generator similar to the ones described with respect to the first and second embodiment of the invention.

Again, a shift register having a plurality of register memory locations 11–14 is provided. Further, first selection means are provided, comprising a plurality of feed-back switches 31–34, each one of the feed-back switches associated with an output terminal of one of the plurality of register memory locations.

Further, second selection means are provided, comprising a plurality of feed-in switches 41–43, each one of the feed-in switches associated with one of the plurality of register memory locations. The input terminals of the plurality of feed-in switches are respectively connected to feeding means 6 as well as to an output terminal of a subsequent register memory location of higher order. The output terminals of the plurality of feed-in switches 41–43 are respectively connected to input terminals of the associated register memory locations, similar to what was described with respect to the first and second embodiment.

Processing means are provided, comprising a plurality of processing units 52–54 connected in series, each one of the processing units associated with one of the plurality of register memory locations and connected to an output terminal of a corresponding feed-back switch. Again, as in the previous examples, the processing means are connected to the feeding means 6.

Said feed-in switches and feed-back switches are again controlled by control means 2. As in the embodiment outlined with respect to FIG. 2b, the plurality of feed-in switches, upon receiving a control signal corresponding to a logical 0, connect the feeding means 6 to a register memory location for providing the feed-back signal as input to the corresponding register memory location. Upon receiving a control signal corresponding to a logical 1, the switches respectively connect register memory locations of subsequent stages.

The plurality of feed-back switches is controlled analogously to the plurality of feed-in switches. Upon receiving a control signal corresponding to a logical 1, each of the plurality of feed-back switches respectively connects an output terminal of a corresponding register memory location to an associated processing unit. Upon receiving a control signal corresponding to a logical 0, the plurality of feed-back switches respectively are in an OFF state and connect an input state corresponding to a logical 0 to the associated processing unit.

The plurality of feed-back switches and the plurality of feed-in switches may comprise multiplexers, as known in the art.

In this third embodiment of the invention, said control means comprises a control memory 21, comprised of a plurality of control memory locations 211–215, at least one of which. respectively being associated with a register memory location.

Each control memory location is able to store information representing a logical 0 or representing a logical 1. The states of the control memory locations 211–215 respectively control the associated feed-back switches 31–34 as well as the associated feed-in switches 41–43. This is accomplished by utilizing an appropriate logic circuitry, comprising, e.g., logical AND and OR gates.

Similar to the second embodiment of the invention described with respect to FIG. 2a, the sequence generator of the third embodiment may be divided into three types of stages. The stages being a first stage including the register memory location of the lowest order, a sequence of second stages, and a final stage, comprising the register memory location of the highest order. The sequence generator according to the third embodiment comprises a single stage of the first type, an arbitrary number of identical stages of the second type and a single stage of the third type.

In the present embodiment, two stages of the second type, indicated S2, S3, are provided. The stage of the first type is denoted S1, the stage of the third type is denoted S4.

In the following, the three different stages of the sequence generator of the third embodiment according to FIG. 3a will be described.

Initially, the first stage will be described, being stage S1 in the example of FIG. 3a. This first stage of the sequence generator consists of a register memory location 11, a first feed-back switch 31, and a first feed-in switch 41. Further, this first stage includes of a control memory location 211 and two logical gates, a first AND-Gate 231 and a first OR-Gate 221.

As outlined before, and as outlined with respect to previous embodiments, the input terminal of register memory location 11 is connected to the output terminal of the first feed-in switch 41. The input terminals of the first feed-in switch 41 are connected to the feeding means 6 and to the output terminal of the register memory location of the succeeding stage higher order, respectively, which in the present case is register memory location 12.

A control input of the first feed-in switch 41 is connected to the output terminal of an OR-gate of the succeeding stages of higher order (second OR-gate 222, of stage S2).

The output terminal of the register memory location 11 of the first stage can be connected to an external device and is further connected to one input terminal of the first feed-back switch 31. The second input terminal of the first feed-back switch 30 is connected to a signal corresponding to a logical 0. Further, the output terminal of the first feed-back switch 31 is connected to the processing unit of the succeeding stage of higher order (stage S2), which in the present case is processing unit 52. The control input of the first feed-back switch 31 is connected to the output terminal of a first AND-Gate 231.

One of the input terminals of the first AND-Gate 231 is connected to the output terminal of the register memory location of the first stage, which in the present case is register memory location 211. The second input terminal of the AND-Gate 231 is connected to the output terminal of a first OR-Gate 221 of the first stage.

One of the input terminals of the first OR-Gate 221 of the first stage is connected to the output terminal of an OR-Gate 221 of the succeeding stage higher order. The second input terminal of the first OR-Gate 231 of the first stage S1 is connected to the output terminal of the control memory location of the succeeding stage higher order, which is control memory location 222.

In the following, exemplified by the second stage S2, the stages of the second type will be described. The stages of the second type, in the example of FIG. 3a stages S2 and S3, are identical in construction and therefore, only the second stage S2 will be described.

A stage of the second type comprises a register memory location, a control memory location, a feed-in switch, a feed-back switch, an AND-gate, an OR-gate and a processing unit. A stage of the second type widely corresponds to the stage of the first type, described above, with the exception of the following.

Instead of being connected to an external device, the output terminal of a register memory location of a stage of the second type is connected to one input terminal of the feed-in switch of a preceding stage of lower order. Further, the output of the OR-gate is connected to an OR-gate of a preceding stage of lower order.

In the present case, exemplified at the second stage S2, the output terminal of register memory location 12 of stage S2 is connected to an input terminal of the feed-in switch 41 of stage S1. Further, the output terminal of the second OR-Gate 222 of the second stage is not only connected to an input terminal of the AND gate of the stage of the second type, but also connected to an input terminal of an OR-Gate of the succeeding stage, which in the example is the first stage S1.

Finally, the output terminal of the first feed-back switch 31 of the second stage S2 is connected to processing unit 52. Further, the processing unit 52 is connected to a processing unit 53 of the third stage S3.

Since stage S3 is also of the second type and therefore is identical to stage S2, a description thereof is omitted.

In the following, stage S4, forming the last stage and being the stage of the third type, will be described.

This last stage of the sequence generator consists of a register memory location 14, two control memory locations 214 and 215, a feed-back switch 34, a fourth AND-Gate 234 and a processing unit 54.

The input terminal of the register memory location 14 is connected to the feeding means 6, its output terminal is connected to the feed-in switch of the succeeding stage, in the present case the third feed-in switch 43 of the third stage S3. Further, the output terminal of register memory location 14 is connected to an input terminal of the fourth feed-back switch 34, the other input of which is connected to a signal corresponding to a logical 0. The output terminal of the feed-back switch 35 is connected to processing unit 54. The processing unit 54 outputs a feed-back signal to the feeding means 6.

The control input of the feed-back switch 34 is connected to the fourth AND-Gate 234. The input terminals of the feed-back switch 34 are connected to the outputs of the control memory locations 214 and 215, respectively. The output terminals of the control memory locations also forms input to the OR-Gate of the preceding stage S3.

It is noted, that the sequence generator outlined with respect to FIG. 3a is not limited to the shown number of stages, an arbitrary number of stages may be provided. If the above circuit is used as a long code generator, e.g. 32 stages may be provided.

As it becomes obvious with description with respect to the circuit diagram of FIG. 3a, the states of the plurality of feed-back switches and the states of the plurality of feed-in switches may be controlled by the states of the plurality of control memory locations 211–215 of said control memory 21. It is noted that the number of control memory locations of the third embodiment of the sequence generator of the invention exceeds the number of register memory locations by one (1).

The operation will be further outlined in the following.

A register memory location of a stage of the first or second type will be selected as a feed-back location, in case the corresponding feed-back switch receives a control signal corresponding to a logical 1. This will be the case, if a value corresponding to a logical 1 is stored at the corresponding control memory location and if any one of the succeeding control memory locations of higher order stores a value corresponding to a logical 1.

A register memory location of a stage of the first or second type will be selected as a feed-in location, in case the corresponding feed-in switch receives a control signal corresponding to a logical 0. If the corresponding feed-in switch receives a control signal corresponding to a logical 1, the register memory location will be connected to the register memory location of the succeeding stage of higher order.

As a result of the cascade of the plurality of OR-gates, a control signal corresponding to a logical 0 will only be applied to a feed-in switch of a current stage, in case all control memory locations corresponding to stages of higher order store control signals corresponding to a logical 0.

The register memory location of the highest order, i.e., of the stage of the third type, will be selected as a feed-back location, in case the two corresponding control memory locations supply a control signal corresponding to a logical 1 to the corresponding AND-gate. The register memory location of the stage of the third type will preferably always be connected to the feeding means 6. A selection as a feed-in location therefore depends upon whether or not any succeeding register memory location is selected as a feed-in location. If any succeeding register memory location is selected as a feed-in location, the register memory location of the highest order will not be selected as a feed-in location.

Therefore, if the sequence of bits stored in the plurality of control memory locations is viewed in descending order, i.e., beginning with the control memory location of the highest order, the first control memory location storing a logical 1 will define the corresponding register memory location as a feed-in location. All feed-in switches of register memory locations of higher order, in this case, necessarily receive a control signal corresponding to a logical 0. They are therefore, in theory, selected as feed-in locations. This, however, has no effect, they do not contribute to the output signal of the sequence generator. They do not contribute to the output signal of the sequence generator, because the feed-back switches will also receive a logical 0 at their control inputs and therefore the respective memory locations will not be selected as feed-back locations.

All register memory locations of lower order succeeding a register memory location selected as a feed-in location cannot be selected as a feed in location, as a result of the cascade connection of OR-gates the corresponding feed-in switches will receive a logical 1 as control signals. Accordingly, all of said succeeding register memory locations of lower order will be connected in series.

Figure 3B:
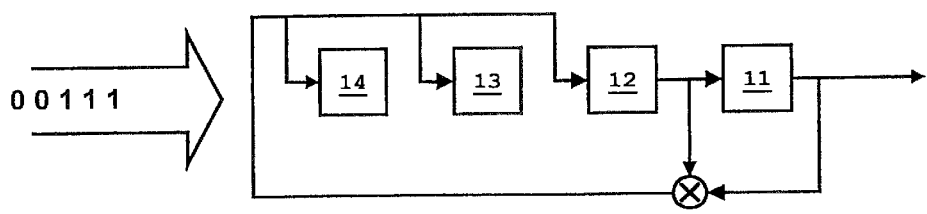
FIGS. 3b and 3c show an exemplary equivalent-circuits of the third embodiment of the invention, according to different programming states.
Figure 3C:
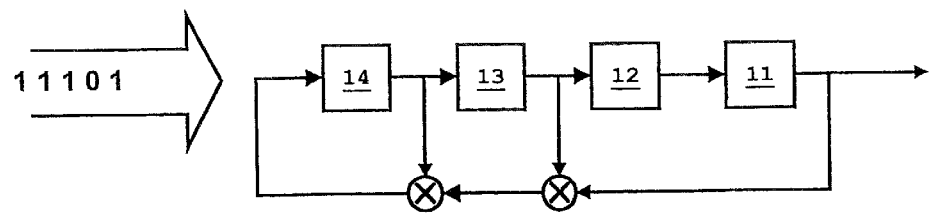

In the following, the operation of the arrangement of the third embodiment is described with respect to FIGS. 3b and 3c. FIGS. 3b, 3c show equivalent-circuits of the third embodiment of the invention, according to different programming states of the control memory.

Firstly, the operation of the sequence generator of FIG. 3a according to a first case of control bits stored in the memory means 21 and a corresponding equivalent-circuits will be outlined with respect to FIG. 3b.

A control sequence corresponding to logical states 0 0 1 1 1 is stored in the control memory. That is, a logical 0 is stored a the fifth control memory location 215, and at the fourth control memory location 214. A logical 1 is stored at the third control memory location 213 as well as at first and second control memory locations 211 and 212.

The first logical 1 of the bit sequence is stored at the control memory location 213. Accordingly, via the second OR-gate 222, a logical 1 will be applied to the control input of the second feed-in switch 42. As a result, the second register memory location 12 will be connected to the feeding means 6 for receiving a feed-back signal. Thus, the second register memory location 12 is selected as a feed-in location, as shown with the equivalent-circuit of FIG. 3b.

With a logical 0 stored at the fourth and fifth control memory location 214 and 215, the third feed-in switch 43 receives a logical 0 at its control input. The third and fourth register memory locations 13 and 14, will also be connected to the feeding means 6. However, as outlined above, this has no effect, since the states of these register memory locations in this case do not contribute to the output signal of the sequence generator.

Further, a logical 1 is stored at the second control memory location 212. Accordingly, with a logical 1 at the third memory location 213, the second AND-gate 232 will output a signal corresponding to a logical 1 to the second feed-back switch 32. As a result, the second register memory location 12 will be selected as a feed-back location, as shown in FIG. 3b.

Analogously, with a logical 1 stored at the first control memory location 211, the first register memory location 11 will be selected as a feed-back location, as to be seen in FIG. 3b.

Secondly, the operation of the sequence generator of FIG. 3a according a second case of control bits stored in the memory means 21 and a corresponding equivalent-circuit will be outlined with respect to FIG. 3c.

A control sequence corresponding to logical states 1 1 1 0 1 is stored in the control memory. That is, a logical 1 is stored at the fifth control memory location 215, at the fourth control memory location 214, and at the third control memory location 213. A logical 0 is stored at the second control memory location 212, and again, a logical 1 is stored at the first control memory locations 211.

With a logical 1 at the fifth control memory location 215, the third feed-in switch 43 will connect fourth and third register memory locations. Analogously, via the plurality of OR-gates, all other register memory locations will be connected in series. This, as shown in FIG. 3c, results in a selection of the fourth register memory location 14 as a feed-in location.

Further, as outlined above, with a logical 1 stored at the first, third and fourth control memory locations 211, 213, 214, the first, third and fourth register memory locations 11, 13, 14 are selected as feed-back locations, as shown in FIG. 3c.

As obvious with the above, the sequence generator shown in FIG. 3a may be differently configured by "programming" different bit sequences.

The functions realized by the above control circuit may be achieved using a different logic circuit, without leaving the scope of the invention. In particular, instead of said memory means 21, in general, any data providing means may be employed.

What is claimed is:

1. An apparatus for generating sequences of values, comprising:
    a shift register having a plurality of register memory locations;
    selection means for selecting at least one arbitrary register memory location as a feed-back location and at least one arbitrary register memory location as a feed-in location;
    processing means for processing output signals received from the at least one arbitrary register memory location selected as the feed-back location;
    feeding means for feeding an output signal from the processing means to the at least one arbitrary register memory location selected as the feed-in location; and
    wherein the selection means comprises a plurality of feed-in switches, each of the plurality of feed-in switches being adapted to connect, dependent on a state of each feed-in switch, an input terminal of a first register memory location to:
        an output terminal of a second register memory location having a next higher order than the first register memory location; or
        the feeding means.

2. The apparatus for generating sequences of values according to claim 1, wherein the selection means furthers includes:
    first selection means for connecting an output terminal of the at least one arbitrary register memory location selected as the feed-back location to the processing means;
    second selection means for connecting the feeding means to an input terminal of the at least one arbitrary register memory location selected as the feed-in location; and
    control means for controlling the first and second selection means.

3. The apparatus for generating sequences of values according to claim 1, wherein the processing means includes a plurality of processing units for processing an output signal of the at least one arbitrary register memory location selected as the feed-back location to form a single signal to be fed via the feeding means to the at least one arbitrary register memory location selected as the feed-in location.

4. The apparatus for generating sequences of values according to claim 1, wherein the processing means performs logical Exclusive OR operations.

5. The apparatus for generating sequences of values according to claim 1, wherein the apparatus is used as a shortcode generator or a longcode generator in a Code Division Multiple Access (CDMA) telecommunications system.

6. An apparatus for generating sequences of values, comprising:
    a shift register having a plurality of register memory locations;
    selection means for selecting at least one arbitrary register memory location as a feed-back location and at least one arbitrary register memory location as a feed-in location;
    processing means for processing output signals received from the at least one arbitrary register memory location selected as the feed-back location;
    feeding means for feeding an output signal from the processing means to the at least one arbitrary register memory location selected as the feed-in location;
    wherein the selection means includes a data providing means for providing binary data for selecting the at least one arbitrary feed-back register memory location and the at least one arbitrary feed-in register memory location; and
    wherein the selection means comprises a plurality of feed-in switches, each of the plurality of feed-in switches being adapted to connect, dependent on a state of each feed-in switch, an input terminal of the at least one arbitrary feed-in register memory location to:
        an output terminal of a register memory location having a next higher order than the at least one arbitrary feed-in register memory location; or
        the feeding means.

7. The apparatus for generating sequences of values according to claim 6, wherein the selection means further includes:
    first selection means for connecting an output terminal of the at least one arbitrary register memory location selected as the feed-back location to the processing means;
    second selection means for connecting the feeding means to an input terminal of the at least one arbitrary register memory location selected as the feed-in location; and
    control means for controlling the first and the second selection means.

8. The apparatus for generating sequences of values according to claim 6, wherein the processing means includes a plurality of processing units for processing an output signal of the at least one arbitrary register memory location selected as the feed-back location to form a single signal, to be fed via the feeding means to the at least one arbitrary register memory location selected as the feed-in location.

9. The apparatus for generating sequences of values according to claim 6, wherein the data providing means comprises control memory means having a plurality of control memory locations for storing a bit sequence, logical values of the bit sequence defining the at least one feed-back location and the at least one feed-in location.

10. The apparatus for generating sequences of values according to claim 7, wherein the first selection means comprises a plurality of feed-back switches, each of the plurality of feed-back switches connected to an output terminal of a corresponding register memory location and controlled by a control signal corresponding to a logical status of at least one associated control memory location.

11. The apparatus for generating sequences of values according to claim 7, wherein the second selection means comprises the plurality of feed-in switches, each of the plurality of feed-in switches connected to an input terminal of a corresponding register memory location and controlled by a control signal corresponding to a logical status of at least one associated control memory location.

12. The apparatus for generating sequences of values according to claim 11, wherein the first selection means comprises a plurality of feed-back switches, each of the plurality of feed-back switches connected to an output terminal of a corresponding register memory location and controlled by a control signal corresponding to a logical status of at least one associated control memory location, and wherein each of the plurality of feed-back switches and each of the plurality of feed-in switches are controlled by a bit sequence stored in the data providing means such that a first logical one of the bit sequence defines the feed-in location and a subsequent logical one of the bit sequence defines the feed-back location.

13. The apparatus for generating sequences of values according to claim 6, wherein the processing means performs logical Exclusive OR operations.

14. The apparatus for generating sequences of values according to claim 6, wherein the apparatus is used as a shortcode generator or a long code generator in a Code Division Multiple Access (CDMA) telecommunications system.

15. An apparatus for generating a sequence of values, comprising:
- a plurality of register memory locations;
- a processing unit adapted to generate a feedback signal from an output of at least one of the plurality of register memory locations;
- a feed-in switch adapted to selectably connect an Input terminal of a first register memory location of the plurality of register memory locations to one of the feedback signal or a second register memory location of the plurality of memory locations;
- wherein the second register memory location has a next higher order than an order of the first register memory location; and
- a feed-back switch that selectably connects at least one of the plurality of register memory locations to the processing unit in response to a control signal.

16. The apparatus for generating a sequence of values according to claim 15, wherein the
- feed-in switch selectably connects the feedback signal to the at least one of the plurality of register memory locations in response to a control signal.

17. The apparatus for generating a sequence of values according to claim 15, wherein the apparatus is adapted to dynamically generate a sequence of values of differing lengths or feedback characteristics in response to a control signal.

18. An apparatus for generating a sequence of values, comprising:
- a plurality of register memory locations arranged in ascending order;
- a plurality of feed-back switches, each feed-back switch associated with one of the plurality of register memory locations and connected to an output terminal of the associated register memory location;
- a plurality of processing units connected in series and adapted to generate a feedback signal, each of the plurality of processing units associated with one of the plurality of register memory locations and connected to an output terminal of a corresponding feed-back switch;
- a plurality of feed-in switches, a first input terminal of each of the plurality of feed-in switches,-being connected to an output terminal of a succeeding register memory location of a next higher order than a corresponding register memory location a second input terminal of each of the plurality of feed-in switches receiving the feedback signal, and an output terminal of each of the plurality of feed-in switches being connected to an input terminal of the corresponding register memory location; and
- wherein each of the plurelity of feed-in switches is adapted to connect, dependent on a state of each feed-in switch, an input terminal of the corresponding register memory location to:
  - an output terminal of a register memory location having the next higher order than the corresponding register memory location; or
  - an output of a processing unit of the plurality of processing units.

19. The apparatus for generating a sequence of values according to claim 18, further comprising a plurality of control memory locations, at least one of which being associated with at least one of the plurality of register memory locations.

20. The apparatus for generating a sequence of values according to claim 19, wherein the plurality of control memory locations selectably control the plurality of feed-back switches and the plurality of feed-in switches.

21. The apparatus for generating a sequence of values according to claim 20, wherein a portion of the plurality of control memory locations selectably controls an arbitrary number of feed-back switches to connect the output terminals of the associated register memory locations to the associated processing units.

22. The apparatus for generating a sequence of values according to claim 20, wherein a portion of the plurality of control memory locations selectably controls an arbitrary feed-back switch to connect the output terminal of the associated register memory location to the associated processing unit.

23. The apparatus for generating a sequence of values according to claim 20, wherein a portion of the plurality of control memory locations selectably controls an arbitrary number of feed-in switches to connect the output terminals of the arbitrary number of feed-in switches to the feedback signal via the second input terminal of each of the arbitrary number of feed-in switches.

24. The apparatus for generating a sequence of values according to claim 20, wherein a portion of the plurality of control memory locations selectably controls an arbitrary feed-in switch to connect the output terminal of the arbitrary feed-in switch to the feedback signal via the second input terminal of the arbitrary feed-in switch.

25. The apparatus for generating a sequence of values according to claim 20, wherein the apparatus is flexibly configured via the plurality of control memory locations to generate sequences of values of differing lengths or feed-back characteristics.

26. The apparatus for generating a sequence of values according to claim 20, wherein the plurality of control memory locations dynamically selectably control the plurality of feed-back switches and the plurality of feed-in switches during operation of the apparatus.

27. The apparatus for generating a sequence of values according to claim 18, wherein the plurality of processing units perform at least one of logical operations and arithmetic operations.

28. The apparatus for generating a sequence of values according to claim 18, wherein each of the plurality of feed-in switches comprises a multiplexer.

29. The apparatus for generating a sequence of values according to claim 18, wherein each of the plurality of feed-back switches comprises a multiplexer.

* * * * *